United States Patent [19]
Ito et al.

[11] Patent Number: 5,932,637
[45] Date of Patent: Aug. 3, 1999

[54] FLAME RETARDANT RESIN COMPOSITION AND LAMINATE USING THE SAME

[75] Inventors: Mikio Ito; Sumiya Miyake, both of Yokohama; Kazuhiko Shibata; Akihiko Tobisawa, both of Fujieda, all of Japan

[73] Assignee: Sumitomo Bakelite Company Limited, Tokyo, Japan

[21] Appl. No.: 08/979,540

[22] Filed: Nov. 26, 1997

[51] Int. Cl.$^6$ ................................................... C08K 5/521
[52] U.S. Cl. ......................... 523/451; 523/452; 523/455
[58] Field of Search .................................. 523/455, 451, 523/452

[56] References Cited

U.S. PATENT DOCUMENTS

| | | | |
|---|---|---|---|
| 3,730,948 | 5/1973 | Akiyama et al. | 523/455 |
| 3,839,358 | 10/1974 | Bargain . | |
| 3,984,373 | 10/1976 | Takahashi et al. | 523/455 |
| 4,401,777 | 8/1983 | Tsuboi et al. | 523/455 |

*Primary Examiner*—Veronica P. Hoke
*Attorney, Agent, or Firm*—Smith, Gambrell & Russell; Beveridge, DeGrandi, Weilacher & Young Intellectual Property Group

[57] ABSTRACT

A flame-retardant resin composition which comprises (A) 100 parts by weight of an unhalogenated epoxy resin having at least two epoxy groups in one molecule, (B) 20 to 205 parts by weight of a maleimide compound having at least one maleimido group in one molecule, (C) 20 to 65 parts by weight of a curing agent having an amino group and (D) a phosphorus compound in a proportion of 0.5 to 4.5 parts by weight in terms of phosphorus element per 100 parts by weight of a total of the components (A), (B) and (C), provided that the proportion of nitrogen element contained in the composition is 2.0 to 10.0 parts by weight per 100 parts by weight of the total composition. The above flame-retardant resin composition has a high flame retardance without adding a halogen compound and does not deteriorate the characteristics of commercial products.

18 Claims, No Drawings

FLAME RETARDANT RESIN COMPOSITION AND LAMINATE USING THE SAME

BACKGROUND OF THE INVENTION

1. Field of the Invention

This invention relates to a flame-retardant resin composition which has an excellent flame retardance without using a halogen-containing flame-retardant and to a laminate in which the same is used.

2. Description of the Related Art

Thermosetting resins, representatives of which are epoxy resins and the like, have excellent characteristics, and hence, have been widely used in parts of electric and electronic appliances and the like, and in many examples, flame retardance has been imparted to the thermosetting resins for making sure the safety for fire. In order to make these resins flame-retardant, it has been general to use a halogen-containing compound such as a brominated epoxy compound and the like. These halogen-containing compounds have a high flame retardance; however, brominated aromatic compounds have the possibility of not only releasing bromine and hydrogen bromide, which are both corrosive, upon thermal decomposition, but also forming polybromodibenzofuran and polybromodibenzodioxine, both of which have a high toxicity, upon decomposition in the presence of oxygen. Moreover, the handling of worn-out scrap materials containing bromine and refuse disposal are very difficult. It is a well-known known fact that for such reasons, phosphorus compounds have been widely studied as flame-retardants to be substituted for the bromine-containing flame-retardants. However, when a phosphorus compound is used alone in thermosetting resins of the epoxy resin type, it is necessary to add a large amount of the phosphorus compound for obtaining a sufficient flame retardance, and this is disadvantageous in that the mechanical, chemical and electrical characteristics are remarkably deteriorated.

OBJECT AND SUMMARY OF THE INVENTION

This invention has been made as a result of extensive research for solving the above-mentioned problems.

An object of this invention is to provide a resin composition which has a high flame retardance without adding a halogen-containing compound and does not deteriorate the characteristics of commercial products.

Another object of this invention is to provide a laminate in which the above resin composition is used.

Other objects and advantages of this invention will become apparent from the following description.

According to this invention, there is provided a flame-retardant resin composition which comprises (A) 100 parts by weight of an unhalogenated epoxy resin having at least two epoxy groups in one molecule, (B) 20 to 205 parts by weight of a maleimide compound having at least one maleimido group in one molecule, (C) 20 to 65 parts by weight of a curing agent having an amino group and (D) a phosphorus compound in a proportion of 0.5 to 4.5 parts by weight in terms of phosphorus element per 100 parts by weight of a total of the components (A), (B) and (C), provided that the proportion of nitrogen element contained in the composition is 2.0 to 10.0 parts by weight per 100 parts by weight of the total composition.

According to this invention, there is also provided a laminate composed of the above flame-retardant resin composition and a substrate.

DETAILED DESCRIPTION OF THE INVENTION

As described above, when a phosphorus compound is used alone in a thermosetting resin of the epoxy resin type, it is necessary to add a large amount of the phosphorus compound for obtaining a sufficient flame retardance, and the addition of the phosphorus compound alone is disadvantageous in that the mechanical, chemical and electrical characteristics are remarkably deteriorated. In this invention, for solving this problem, it has been made possible to reduce the amount of the phosphorus element for obtaining a flame retardance by a synergistic effect obtained by allowing nitrogen element to exist together with the phosphorus element. Furthermore, in this invention, it is the essential point of technique to introduce a nitrogen-containing ring structure into the resin skeleton, thereby enhancing the flame retardance and heat resistance, and to further reduce the amount of the phosphorus element contained, thereby reconciling flame retardance and heat resistance.

In this invention, the unhalogenated epoxy resin having at least two epoxy groups in one molecule [the component (A)] includes bisphenol A type epoxy reins, bisphenol F type epoxy resins, bisphenol S type epoxy resins, phenol novolac type epoxy resins, cresol novolac type epoxy resins, naphthalene type epoxy resins, biphenyl type epoxy resins, and N-glycidyl compounds resulting from an aromatic amine and a heterocyclic nitrogen base, for example, N,N-diglycidylaniline, triglycidyl isocyanurate, N,N,N',N'-tetraglycidyl-bis(p-aminophenyl)methane and the like. The above epoxy resin (A) is, however, not particularly limited to the above resins. These can be used in admixture of two or more. However, this invention aims at providing a resin composition free from a halogen-containing flame-retardant, so that halogen-containing epoxy resins such as brominated bisphenol A type epoxy resins, brominated novolac type epoxy resins and the like are excluded. Nevertheless, in view of the process of producing an epoxy resin, the chlorine contained in a conventional epoxy resin resulting from epichlorohydrin used as the starting material becomes unavoidably contained in the epoxy resin (A), though the amount of the chlorine is a level known in the art, namely the order of several hundreds of ppm as hydrolyzable chlorine.

The maleimide compound having at least one maleimido group in one molecule used as the component (B) in this invention includes N-methylmaleimide, N-butylmaleimide, N-octylmaleimide, N-dodecylmaleimide, N-stearylmaleimide, N-cyclohexylmaleimide, N-phenylmaleimide, N-(o-tolyl)maleimide, N-dodecylphenylmaleimide, N-(o- or p-hydroxyphenyl) maleimide, N-(o- or m-methoxy-phenyl)maleimide, N-(m-hydroxycarbonylphenyl)maleimide, N-(m-nitrophenyl) maleimide, 1-methyl-2,4-bismaleimidobenzene, N,N'-m-phenylene bismaleimide, N,N'-p-phenylene bismaleimide, N,N'-m-toluylene bismaleimide, N,N'-4,4'-biphenylene bismaleimide, N,N'-4,4'-[3,3'-dimethylbiphenylene] bismaleimide, N,N'-4,4'-[3,3'-dimethyldiphenylmethane] bismaleimide, N,N'-4,4'-[3,3'-diethyldiphenylmethane] bismaleimide, N,N'-4,4'-diphenylmethane bismaleimide, N,N'-4,4'-diphenyl ether bismaleimide, N,N'-3,3'-diphenylsulfone bismaleimide, N,N'-4,4'-diphenylsulfone bismaleimide, 2,2-bis[4-(4-maleimidophenoxy)phenyl] propane, 2,2-bis[3-t-butyl-4-(4-maleimidophenoxy)phenyl] propane, 2,2-bis[3-s-butyl-4-(4-maleimidophenoxy)phenyl] propane, 1,1-bis[4-(4-maleimidophenoxy)phenyl]decane, 1,1-bis[2-methyl-4-(4-maleimidophenoxy)-5-t-butylphenyl]-2-methylpropane, 4,4'-cyclohexylidene-bis[1-(4-maleimidophenoxy)-2-(1,1-dimethylethyl)benzene], 4,4'-methylene-bis[1-(4-maleimidophenoxy)-2,6-bis(1,1-dimethylethyl)benzene], 4,4'-methylene-bis[1-(4- maleimidophenoxy)-2,6-di-s-butylbenzene], 4,4'-cyclohexylidene-bis[1-(4-maleimidophenoxy)-2-cyclohexylbenzene], 4,4'-methylene-bis[1-(maleimidophenoxy)-2-nonylbenzene], 4,4'-(1-methylethylidene)-bis[1-(maleimidophenoxy)-2,6-bis(1,1-dimethylethyl)benzene], 4,4'-(2-ethylhexylidene)-bis[1-(maleimidophenoxy)benzene], 4,4'-(1-methylheptylidene)-bis[1-(maleimidophenoxy)benzene], 4,4'-cyclohexylidene-bis[1-(maleimidophenoxy)-3-methylbenzene], 2,2'-bis[4-(4-maleimidophenoxy)phenyl]propane, 2,2'-bis[3-methyl-4-(4-maleimidophenoxy)phenyl]propane, 2,2'-bis[3,5-dimethyl-4-(4-maleimidophenoxy)phenyl]propane, 2,2'-bis[3-ethyl-4-(4-maleimidophenoxy)phenyl]propane, bis[3-methyl-(4-maleimidophenoxy)phenyl]methane, bis[3,5-dimethyl-(4-maleimidophenoxy)phenyl]methane, bis[3-ethyl(4-maleimidophenoxy)phenyl]methane, 3,8-bis[4-(4-maleimidophenoxy)phenyl]-tricyclo-[5,2,1,0$^{2 \cdot 6}$]decane, 4,8-bis[4-(4-maleimidophenoxy)phenyl]-tricyclo-[5,2,1,0$^{2 \cdot 6}$]decane, 3,9-bis[4-(4-maleimidophenoxy)phenyl]-tricyclo-[5,2,1,0$^{2 \cdot 6}$]decane, 4,9-bis[4-(4-maleimidophenoxy)phenyl]-tricyclo-[5,2,1,0$^{2 \cdot 6}$]decane and the like; however, the component (B) is not particularly limited to the above compounds. In view of heat resistance, price, feed stability, wide use and the like, aromatic bismaleimides and N-substituted aromatic monomaleimides are preferable, and N,N'-4,4'-diphenylmethane bismaleimide is more preferable. In addition, it is not objectionable to use Michael addition to amines and ene reaction with allyl compounds in the control of crosslink density and dissolvability of the maleimide in solvents.

The curing agent (C) having an amino group used in this invention includes C$_2$–C$_{20}$ straight chain aliphatic diamines such as ethylenediamine, trimethylenediamine, tetramethylenediamine, hexamethylenediamine and the like, metaphenylenediamine, paraphenylenediamine, paraxylenediamine, 4,4'-diaminodiphenylmethane, 4,4'-diaminodiphenylpropane, 4,4'-diaminodiphenyl ether, 4,4'-diaminodiphenylsulfone, 4,4'-diaminodicyclohexane, bis(4-aminophenyl)phenylmethane, 1,5-diaminonaphthalene, metaxylylenediamine, paraxylylenediamine, 1,1-bis(4-aminophenyl)cyclohexane, dicyanodiamide and the like; however it is not particularly limited thereto. In view of heat resistance, price, feed stability, wide use and the like, aromatic diamines are preferable, and 4,4'-diaminodiphenylmethane is more preferable.

The phosphorus compound (D) used in this invention includes phosphoric esters such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate, 2-ethylhexyl diphenyl phosphate, tris(2,6-dimethylphenyl) phosphate, resorcin diphenyl phosphate and the like; condensed phosphoric esters such as ammonium polyphosphate, polyphosphoramidate, and the like; red phosphorus, guanidine phosphate, dialkyl hydroxymethyl phosphonate and the like; however, it is not particularly limited to the above compounds. These compounds can be used in combination of two or more.

The flame-retardant resin composition of this invention is obtained by compounding the component (A), namely an unhalogenated epoxy resin having at least two epoxy groups in one molecule; the component (B), namely a maleimide compound having at least one maleimido group in one molecule; the component (C), namely a curing agent having an amino group; and the component (D), namely a phosphorus compound, and the compounding proportions of them are such that per 100 parts by weight of the component (A), the proportion of the component (B) is 20 to 205 parts by weight and the proportion of the component (C) is 20 to 65 parts by weight; and the proportion of the component (D) is 0.5 to 4.5 parts by weight in terms of phosphorus element per 100 parts by weight of a total of the components (A), (B) and (C), provided that the proportion of nitrogen element contained in the composition is 2.0 to 10.0 parts by weight per 100 parts by weight of the total composition.

When the proportion of the component (B) is less than 20 parts by weight per 100 parts by weight of the component (A), the effect of the component (B) on the flame retardance is small and the heat resistance is deteriorated, and when it exceeds 205 parts by weight per 100 parts by weight of the component (A), the deterioration of adhesiveness is caused. Therefore, these proportions are not desirable.

When the proportion of the component (C) is less than 20 parts by weight per 100 parts by weight of the component (A), the resin is not sufficiently cured, and when it exceeds 65 parts by weight per 100 parts by weight of the component (A), the amino group remains in a large amount and the moisture resistance is deteriorated. Therefore, these proportions are not desirable.

As to the component (D), when the proportion of phosphorus element is less than 0.5 part by weight per 100 parts by weight of a total of the components (A), (B) and (C), the effect of the component (D) on flame retardance is small, and when it exceeds 4.5 parts by weight per 100 parts by weight of a total of the components (A), (B) and (C), the deterioration of heat resistance is caused. Therefore, these proportions are not desirable.

Moreover, when the proportion of nitrogen element is less than 2.0 parts by weight per 100 parts by weight of the total composition, the effect of nitrogen element on flame retardance is small and when it exceeds 10.0 parts by weight per 100 parts by weight of the total composition, the moisture resistance is deteriorated. Therefore, these proportions are not desirable.

The flame-retardant resin composition of this invention is utilized in various forms, and when a substrate is impregnated therewith, a solvent is usually used. This solvent is required to exhibit a good dissolving power to a part or all of the components of the composition. However, a poor solvent can also be used to such an extent that it does not adversely affect the composition. Examples of the solvent which can be used in this invention, include ketone type solvents such as acetone, methyl ethyl ketone, methyl isobutyl ketone, cyclohexanone and the like; aromatic hydrocarbon type solvents such as toluene, xylene, mesitylene and the like; various glycol ether type solvents such as methyl Cellosolve, ethyl Cellosolve, butyl Cellosolve, isobutyl Cellosolve, diethylene glycol monomethyl ether, triethylene glycol monomethyl ether, propylene glycol monomethyl ether, dipropylene glycol monomethyl ether, propylene glycol monopropyl ether, dipropylene glycol monopropyl ether, ethylene glycol monoisopropyl ether, diethylene glycol monoisopropyl ether, diethylene glycol monobutyl ether and the like; ester type solvents such as methyl Cellosolve acetate, ethyl Cellosolve acetate, butyl Cellosolve acetate, ethyl acetate and the like; dialkylene glycol dialkyl ether type solvents such as diethylene glycol dimethyl ether, diethylene glycol diethyl ether, diethylene glycol dibutyl ether and the like; amide type solvents such as N,N-dimethylacetamide, N,N-dimethylformamide, N-methyl-2-pyrrolidone and the like; and alcohol type solvents such as methanol, ethanol and the like. These can be used in combination of two or more.

When a substrate such as a glass woven fabric, a glass nonwoven fabric, paper or a fabric composed of other components than glass is coated and impregnated with a varnish obtained by dissolving the resin composition of this invention in the above-mentioned solvent, and the impregnated substrate is then dried in an oven at a temperature within the range of from 80° C. to 200° C., a prepreg for printed circuit board can be obtained. This prepreg is heated and pressed to produce a printed circuit board. The resin composition of this invention has a high flame retardance without adding a halogen compound and comprises a thermosetting resin which does not adversely affect the characteristics of commercial products, so that it is suitably used in a laminate, a metal-clad laminate or the like.

DESCRIPTION OF PREFERRED EMBODIMENTS

Example 1

An N,N-dimethylformamide/methyl ethyl ketone=1/1 mixed solvent was added to 100 parts by weight of a phenol novolac type epoxy resin manufactured by DAINIPPON INK & CHEMICALS INC. (EPICLON N-770), 193 parts by weight of N,N'-4,4'-diphenylmethane bismaleimide manufactured by K.I CHEMICAL INDUSTRY CO., LTD. (BMI-H), 61 parts by weight of 4,4'-diaminodiphenylmethane and 100 parts by weight of triphenyl phosphate to prepare a varnish so that the nonvolatile matter concentration became 50%. At this time, the proportion of phosphorus element was 2.7 parts by weight per 100 parts by weight of a total of the epoxy resin, the maleimide compound and the curing agent.

100 parts by weight of a glass cloth (thickness: 0.18 mm) manufactured by NITTO BOSEKI CO., LTD. was impregnated with the above varnish in an amount of 80 parts by weight in terms of the varnish solid content, and then dried in an oven at 150° C. for 4 minutes to prepare a prepreg having a resin content of 44.4% by weight. Eight sheets of the prepreg thus obtained was put one on another and on each of the top and bottom of the resulting assembly was put an electrolytic copper foil having a thickness of 35 μm, and the resulting assembly was subjected to hot press molding at a pressure of 40 kgf/cm$^2$ at a temperature of 170° C. for 120 minutes, to obtain a double-side copper-clad laminate having a thickness of 1.6 mm.

The flame retardance of the laminate thus obtained was evaluated by a vertical burning test method according to the UL-94 standard. The soldering heat resistance and peel strength were measured according to JIS C 6481, and in the soldering heat resistance measurement, the laminate was subjected to moisture-absorption treatment by boiling for 2 hours, thereafter allowed to float on a solder bath at 260° C. for 180 seconds after which the appearance was checked. Moreover, the glass transition temperature was determined from the peak temperature of tan δ according to a viscoelasticity method. The results obtained are shown in Table 1.

TABLE 1

| | Items | Example 1 | Example 2 | Example 3 | Example 4 | Example 5 | Example 6 | Example 7 |
|---|---|---|---|---|---|---|---|---|
| Compounded amount (part by wt.) | EPICLON N-770[1] | 100 | 80 | 100 | — | 100 | 100 | 100 |
| | Ep 1001[2] | — | 20 | — | — | — | — | — |
| | Triglycidyl isocyanurate | — | — | — | 100 | — | — | — |
| | BMI-H[3] | 193 | 193 | 193 | 88 | 54 | 24 | 22 |
| | 4,4'-Diaminodiphenylmethane | 61 | 61 | 61 | 36 | 32 | 26 | 23 |
| | Triphenyl phosphate | 100 | 100 | — | 46 | 15 | 42 | 65 |
| | CR-741[4] | — | — | 100 | — | — | — | — |
| Phosphorus element (part by wt.)[5] | | 2.7 | 2.7 | 2.3 | 2.0 | 0.8 | 2.7 | 4.3 |
| Nitrogen element (part by wt.)[6] | | 5.2 | 5.2 | 5.2 | 9.6 | 2.2 | 2.9 | 2.4 |
| Characteristics | Flame retardance test (UL 94) | V-0 | V-0 | V-0 | V-0 | V-0 | V-0 | V-0 |
| | Soldering heat resistance[7] | Pass | Pass | Pass | Pass | Pass | Pass | Pass |
| | Peel strength (KN/cm) | 1.5 | 1.8 | 1.5 | 1.7 | 1.9 | 1.8 | 1.6 |
| | Tg (DMA method) (° C.) | 175 | 165 | 173 | 168 | 170 | 155 | 150 |

Note:
[1]: Phenol novolac type epoxy resin manufactured by DAINIPPON INK & CHEMICALS INC.
[2]: Bisphenol A type epoxy resin manufactured by Yuka-Shell Epoxy Co., Ltd.
[3]: N,N'-4,4'-Diphenylmethane bismaleimide manufactured by Keiai Kasei K.K.
[4]: Condensed phosphoric acid ester manufactured by Daihachi Kagaku Kogyo K.K.
[5]: Parts by weight of phosphorus element per 100 parts by weight of a total of epoxy resin, maleimide compound and curing agent.
[6]: Parts by weight of nitrogen element per 100 parts by weight of the total composition.
[7]: Appearance after the sample was subjected to moisture absorption treatment of boiling for 2 hours and then allowed to float on a solder bath at 260° C. for 180 seconds.

TABLE 2

| Items | | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|
| Compounded amount (part by wt.) | EPICLON N-770 | 100 | 100 | 100 | 100 | 100 | 100 | — |
| | Triglycidyl isocyanurate | — | — | — | — | — | — | 100 |
| | BMI-H | 15 | 88 | 210 | 88 | 88 | 88 | 110 |
| | 4,4'-Diaminodi-phenylmethane | 22 | 36 | 61 | 36 | 15 | 70 | 38 |
| | Triphenyl phosphate | 46 | 10 | 100 | 145 | 46 | 46 | — |
| | Red phosphorus | — | — | — | — | — | — | 3 |
| Phosphorus element (part by wt.) | | 3.2 | 0.4 | 2.6 | 6.1 | 2.2 | 1.7 | 1.2 |
| Nitrogen element (part by wt.) | | 2.3 | 5.1 | 5.3 | 3.2 | 3.6 | 5.5 | 11.2 |
| Characteristics | Flame retardance test (UL 94) | V-1 | V-1 | V-0 | V-0 | V-0 | V-0 | V-0 |
| | Soldering heat resistance | Pass | Pass | Blistered | Blistered | Blistered | Blistered | Blistered |
| | Peel strength (KN/cm) | 1.9 | 1.6 | 1.1 | 1.2 | 1.3 | 1.3 | 1.2 |
| | Tg (DMA method) (° C.) | 140 | 175 | 185 | 121 | 138 | 156 | 156 |

Examples 2 to 7 and Comparative Examples 1 to 7

The same procedure as in Example 1 was repeated, except that the formulations shown in Tables 1 and 2 were used, to prepare copper-clad laminates. The evaluation results obtained are shown in Tables 1 and 2. The laminates obtained according to the formulations shown in the Examples are all excellent in flame retardance, soldering heat resistance and adhesive properties.

The flame-retardant resin composition of this invention has a high flame retardance without adding a halogen compound and also has an excellent heat resistance and excellent adhesive properties together, and this invention provides a novel, flame-retardant, thermosetting resin composition as a nonhalogen material which will be required in the future.

What is claimed is:

1. A laminate which comprises a flame-retardant resin composition and a substrate,
   wherein the flame retardant resin composition consists essentially of (A) 100 parts by weight of an unhalogenated epoxy resin having at least two epoxy groups in one molecule, (B) 20 to 205 parts by weight of a maleimide compound having at least one maleimido group in one molecule, (C) 20 to 65 parts by weight of a curing agent having an amino group and (D) a phosphorous compound in a proportion of 0.5 to 4.5 parts by weight in terms of phosphorus element per 100 parts by weight of a total of the components (A), (B) and (C), provided that the proportion of nitrogen element contained in the composition is 2.0 to 10.0 parts by weight per 100 parts by weight of the total composition,
   wherein said laminate has a flame retardance of V-0 in UL-94 standard, a satisfactory soldering heat resistance when subjected to moisture absorption by boiling for 2 hours and successive floating on a solder bath at 260° C. for 180 seconds, and a glass transition temperature of 150° C. or higher.

2. The laminate according to claim 1, wherein the maleimide compound (B) is an aromatic bismaleimide, an N-substituted aromatic mono-maleimide or a mixture of the two.

3. The laminate according to claim 1, wherein the maleimide compound (B) is N,N'-4,4'-diphenylmethane bismaleimide.

4. The laminate according to claim 1, wherein the curing agent (C) is an aromatic diamine.

5. The laminate according to claim 1, wherein the phosphorous compound (D) is a phosphoric ester or a condensed phosphoric ester.

6. The laminate according to claim 1, wherein the curing agent (C) is 4,4'-diaminodiphenylmethane.

7. The laminate according to claim 1 wherein said component (A) is a phenol novolac epoxy resin in a proportion of 100 parts, component (B) is N,N'-4,4'-diphenylmethane bismaleimide in a proportion of from 22 to 193 parts, component (C) is 4,4'- diaminodiphenylmethane in a proportion of from 23 to 61 parts, component (D) is triphenyl phosphate in a proportion of from 15 to 100 parts, said phosphorus element is from 0.8 to 4.3 parts, and said nitrogen element is in a proportion of from 2.2 to 5.2 parts.

8. A laminate according to claim 1 comprising a glass fabric impregnated with the flame retardant resin composition.

9. The laminate according to claim 7 wherein said laminate is metal-clad.

10. The laminate according to claim 9, wherein said laminate is copper-clad.

11. The laminate defined in claim 1 wherein
    said maleimide compound (B) is present in an amount of 22 to 193 parts by weight;
    wherein said curing agent (C) is present in an amount of 23 to 61 parts by weight;
    wherein said phosphorous compound (D) is present in an amount of 0.8 to 4.3 parts by weight in terms of said phosphorus element; and
    wherein said nitrogen element is present in an amount of 2.2 to 9.6 parts by weight.

12. The laminate according to claim 1 wherein said laminate is metal-clad.

13. The laminate according to claim 12 wherein said laminate is copper-clad.

14. The laminate according to claim 13 which constitutes a printed circuit board.

15. A laminate comprising a flame-retardant resin composition and a substrate, wherein said laminate is made from a flame-retardant resin composition comprising, (A) 100 parts by weight of an unhalogenated epoxy resin having at least two epoxy groups in one molecule, (B) 20 to 205 parts by weight of a maleimide compound having at least one malemido group in one molecule, (C) 20 to 65 parts by weight of a curing agent having an amino group and (D) a phosphorous compound in a proportion of 0.5 to 4.5 parts by weight in terms of phosphorus element per 100 parts by weight of a total of the components (A), (B) and (C), provided that the proportion of nitrogen element contained in the composition is 2.0 to 10.0 parts by weight per 100 parts by weight of the total composition, wherein said laminate has a flame retardance of V-0 in UL-94 standard, a satisfactory soldering heat resistance when subjected to moisture absorption by boiling for 2 hours and successive floating on a solder bath at 260° C. for 180 seconds, and a glass transition temperature of 150° C. or higher.

16. The laminate defined in claim 15 wherein said flame-retardant resin composition further comprises a solvent.

17. The laminate according to claim 16, wherein said solvent is at least one member selected from the group consisting of ketones, aromatic hydrocarbons, glycol ethers, esters, dialkylene glycol dialkyl ethers, amides, and alcohols.

18. The laminate according to claim 16 wherein said component (A) is a phenol novolac epoxy resin in a proportion of 100 parts, component (B) is N,N'-4,4'-diphenylmethane bismaleimide in a proportion of from 22 to 193 parts, component (C) is 4,4'-diaminodiphenylmethane in a proportion of from 23 to 61 parts, component (D) is triphenyl phosphate in a proportion of from 15 to 100 parts, said solvent is N,N-dimethylformamide/methyl ethyl ketone, said proportion of said phosphorus element is from 0.8 to 4.3 parts, and said nitrogen element is in a proportion of from 2.2 to 5.2 parts.

* * * * *